United States Patent
Choi et al.

(10) Patent No.: US 10,241,701 B2
(45) Date of Patent: Mar. 26, 2019

(54) SOLID STATE MEMORY SYSTEM WITH POWER MANAGEMENT MECHANISM AND METHOD OF OPERATION THEREOF

(71) Applicant: Samsung Electronics Co., Ltd., Suwon-si, Gyeonggi-Do (KR)

(72) Inventors: Inseok Stephen Choi, Redwood City, CA (US); Byoung Young Ahn, San Jose, CA (US); Yang Seok Ki, Palo Alto, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 296 days.

(21) Appl. No.: 14/976,309

(22) Filed: Dec. 21, 2015

(65) Prior Publication Data

US 2017/0075610 A1   Mar. 16, 2017

Related U.S. Application Data

(60) Provisional application No. 62/219,213, filed on Sep. 16, 2015.

(51) Int. Cl.
| | |
|---|---|
| *G06F 12/02* | (2006.01) |
| *G06F 3/06* | (2006.01) |
| *G06F 1/32* | (2019.01) |
| *G06F 1/3234* | (2019.01) |
| *G06F 1/3296* | (2019.01) |
| *G11C 5/14* | (2006.01) |
| *G11C 16/30* | (2006.01) |

(52) U.S. Cl.
CPC .............. *G06F 3/0625* (2013.01); *G06F 1/32* (2013.01); *G06F 1/3275* (2013.01); *G06F 1/3296* (2013.01); *G06F 3/0659* (2013.01); *G06F 3/0688* (2013.01); *G11C 5/148* (2013.01); *G11C 16/30* (2013.01); *Y02B 60/1228* (2013.01); *Y02B 60/1285* (2013.01); *Y02D 10/14* (2018.01); *Y02D 10/172* (2018.01)

(58) Field of Classification Search
CPC ........ G06F 1/32; G06F 1/3275; G06F 1/3296; G06F 3/0625; G06F 3/0659; G06F 3/0688; G06F 12/0246; G11C 16/30; G11C 5/148; Y02B 60/1228; Y02B 60/1285
USPC .................................................. 711/103, 115
See application file for complete search history.

(56) References Cited

U.S. PATENT DOCUMENTS

| | | |
|---|---|---|
| 7,793,059 B2 | 9/2010 | Cornwell et al. |
| 8,555,095 B2 | 10/2013 | Byom et al. |
| | (Continued) | |

OTHER PUBLICATIONS

U.S. Appl. No. 14/967,266, filed Dec. 11, 2015.
U.S. Appl. No. 14/967,220, filed Dec. 11, 2015.

*Primary Examiner* — Yaima Rigol
(74) *Attorney, Agent, or Firm* — Perspectives Law Group, Corp.

(57) ABSTRACT

A solid state memory system includes: an interface circuit; a device processor, coupled to the interface circuit, configured to receive a dynamic power limit command through the interface circuit and update a metadata log based on the dynamic power limit command; a non-volatile memory array coupled to the interface circuit; and a power manager unit, coupled between the device processor and the non-volatile memory array, configured to alter an operating configuration of the non-volatile memory array to meet the requirement of the dynamic power limit command.

20 Claims, 6 Drawing Sheets

(56) References Cited

U.S. PATENT DOCUMENTS

| | | | |
|---|---|---|---|
| 8,694,719 B2 | 4/2014 | Lassa et al. | |
| 8,725,928 B1 * | 5/2014 | Barkley | G11C 14/009 |
| | | | 711/103 |
| 8,751,836 B1 * | 6/2014 | Piszczek | G06F 1/3268 |
| | | | 713/300 |
| 2007/0041257 A1 * | 2/2007 | Kim | G11C 7/08 |
| | | | 365/207 |
| 2009/0067239 A1 * | 3/2009 | Tran | G11C 8/10 |
| | | | 365/185.03 |
| 2010/0070798 A1 * | 3/2010 | Cornwell | G11C 11/5642 |
| | | | 714/5.1 |
| 2010/0185833 A1 * | 7/2010 | Saito | G06F 1/3203 |
| | | | 712/203 |
| 2011/0258367 A1 * | 10/2011 | Tanaka | G06F 1/3203 |
| | | | 711/103 |
| 2012/0017099 A1 * | 1/2012 | David | G06F 1/3203 |
| | | | 713/300 |
| 2012/0317433 A1 * | 12/2012 | Ellis | G06F 11/1441 |
| | | | 713/340 |
| 2013/0124888 A1 | 5/2013 | Tanaka et al. | |
| 2014/0201132 A1 | 7/2014 | Konik et al. | |
| 2014/0281600 A1 * | 9/2014 | Wells | G06F 1/3275 |
| | | | 713/320 |
| 2016/0041760 A1 * | 2/2016 | Kuang | G11C 16/3495 |
| | | | 711/103 |
| 2016/0225459 A1 * | 8/2016 | Boysan | G11C 16/30 |

* cited by examiner

SOLID STATE MEMORY SYSTEM WITH POWER MANAGEMENT MECHANISM AND METHOD OF OPERATION THEREOF

CROSS REFERENCE TO RELATED APPLICATION(S)

This application claims the benefit of U.S. Provisional Patent Application Ser. No. 62/219,213 filed Sep. 16, 2015, and the subject matter thereof is incorporated by reference herein.

TECHNICAL FIELD

An embodiment of the present invention relates generally to an electronic system, and more particularly to a system for data storage functions for electronic systems.

BACKGROUND

Power consumption of electric devices has become a critical metric, along with traditional performance metrics, both for data center and consumer markets. In the data center, cooling costs can represent up to one third of the total costs of operation, so power consumption cannot be a lower priority consideration any more. In addition to this, modern data center servers have begun to adopt high performance SSDs such as NVMe devices. NVMe devices commonly utilize high-performance CPUs and large DRAM's to provide higher performance compared to other SSDs. Such high-performance devices can easily consume 25 W, which is a significant amount of power consumption even in the data center configuration.

The same principal is directly applicable to consumer markets. Consumer mobile devices, such as laptop, have begun to adopt high performance SSDs, such as PCIe-based devices. As such, power consumption of SSDs can become a concern for battery life and device cooling.

Thus, a need still remains for a solid state memory system with power management mechanism to improve execution reliability and performance in power critical computing environments. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides a solid state memory system including: an interface circuit; a device processor, coupled to the interface circuit, configured to receive a dynamic power limit command through the interface circuit and update a metadata log based on the dynamic power limit command; a non-volatile memory array coupled to the interface circuit; and a power manager unit, coupled between the device processor and the non-volatile memory array, configured to alter an operating configuration of the non-volatile memory array to meet the requirement of the dynamic power limit command.

An embodiment of the present invention provides a method of operation of a solid state memory system including: receiving a dynamic power limit command through an interface circuit; configuring a power manager unit for altering a configuration of a non-volatile memory array for meeting a requirement of the dynamic power limit command; and updating a metadata log with configuration data from the power manager unit.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
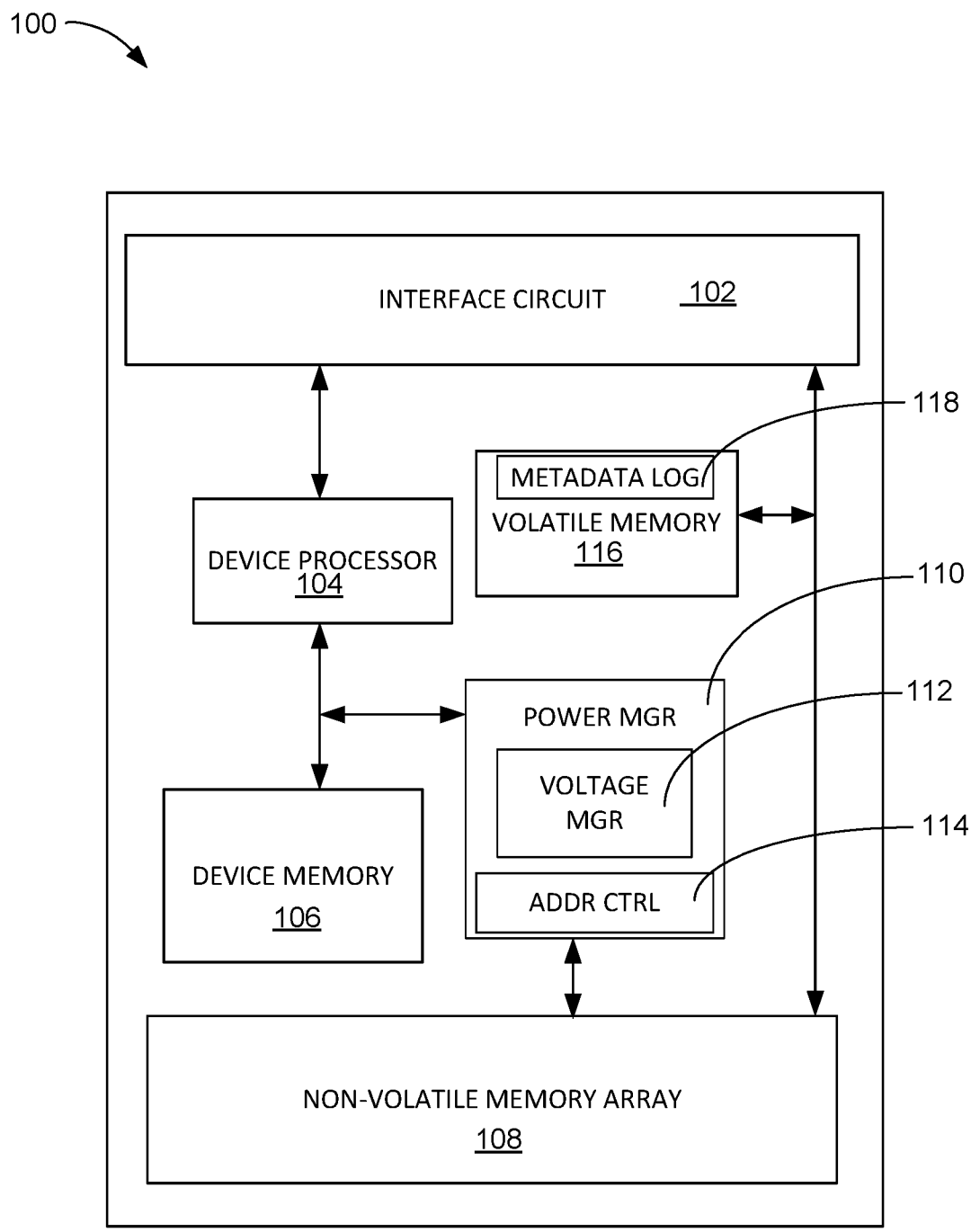
FIG. 1 is a hardware block diagram of a solid state memory system with power management mechanism in an embodiment.

Various embodiments provide a method of operating a solid state memory system with power management by receiving a dynamic power limit command and determining an operating power level for the dynamic power limit command.

Various embodiments provide a solid state memory system with dynamic power management that receive a dynamic power limit command and determine an operating power level for the dynamic power limit command.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation. The embodiments have been numbered first embodiment, second embodiment, etc. as a matter of descriptive convenience and are not intended to have any other significance or provide limitations for an embodiment of the present invention.

The term "module" referred to herein can include software, hardware, or a combination thereof in an embodiment of the present invention in accordance with the context in which the term is used. For example, the software can be machine code, firmware, embedded code, and application software. Also for example, the hardware can be circuitry, processor, computer, integrated circuit, integrated circuit cores, a pressure sensor, an inertial sensor, a microelectromechanical system (MEMS), passive devices, or a combination thereof. Further, if a module is written in the apparatus claims section below, the modules are deemed to include hardware circuitry for the purposes and the scope of apparatus claims.

The term "unit" referred to herein is a circuit formed of hardware components or hardware state machines used for specific functions. The "unit" can be for timing critical functions and does not necessarily include software functions or support.

Referring now to FIG. 1, therein is shown a hardware block diagram of a solid state memory system 100 with power management mechanism in an embodiment. The solid state memory system 100 includes an interface circuit 102 for communicating with a host system (not shown). The interface circuit 102 can transfer device operation commands and user data for processing in the solid state memory system 100. The interface circuit 102, can include a peripheral computer interface express (PCI-e), fiber channel (FC), Ethernet, small computer system interface (SCSI), serial attached SCSI (SAS), memory bus, or the like, that can deliver host commands and user data for processing. A device processor 104, coupled to the interface circuit 102, can include a microprocessor, an embedded processor, a sequential state machine, a PLD, or a microcomputer.

The interface circuit 102 can receive device operation commands, such as read/write, reset, read status, or the like, as well as dynamic power limit commands. In applications where the solid state memory system 100 plays a power critical role, the device processor 104 can interpret the dynamic power limit command and take appropriate action to limit the power consumed by the execution of the device operation commands.

The device processor 104 can be coupled to a device memory 106, such as a non-volatile memory, a volatile memory, or a combination thereof. The device memory 106 can be used as a scratch pad for the device processor 104 in order to maintain command execution status, power level restrictions, and configuration of a non-volatile memory array 108. The device processor can also be coupled to a power manager unit 110, which can alter the operating configuration of the non-volatile memory array 108 by adjusting the voltage level of write/erase voltages, removing power from memory segments of the non-volatile memory array 108, altering addressing of segments within the non-volatile memory array 108, or a combination thereof. The non-volatile memory array 108 can be an array of non-volatile memory devices including flash memory, multi-level cell (MLC) flash memory, three-level cell (TLC) flash memory, magnetoresistive random access memory, Ferroelectric random access memory, or phase-change random access memory. It is understood that the interface circuit 102, the device processor 104, the device memory 106, and the power manager unit 110 can be integrated into a single component, such as a system-on-a-chip (SOC), a gate array, a custom logic chip, a field programmable gate array, or an application specific integrated circuit (ASIC).

The power manager unit 110 can include a voltage manager unit 112 and an address control unit 114. The power manager unit 110 can adjust the operational voltages used to read, write, and erase the segments of the non-volatile memory array 108, including source voltages and threshold voltages. The power manager unit 110 can completely disconnect some of the segments of the non-volatile memory array 108 from the source voltages in the event of severe power limitations.

The voltage manager unit 112 can configure the solid state memory system 100 for reduced performance operation based on power restrictions specified by the device processor 104 based on the receipt of the power limitation command. The reduced performance operation can include reduced operational bandwidth, extended execution times, reduced capacity, or a combination thereof. The voltage manager unit 112 can monitor a voltage feedback in order to verify the limit established by the power manager unit 110 is not exceeded.

The address control unit 114 can modify the configuration and addressing of memory segments, including chips, memory elements, or pages within the non-volatile memory array 108 in order to execute the user data commands, while under some level of the power limitation command. The address control unit 114 can accommodate the restricted use of some of the segments of the non-volatile memory array 108 in order to satisfy the demand placed on the power manager unit 110.

A volatile memory 116 can be coupled between the interface circuit 102 and the non-volatile memory array 108. The volatile memory 116 can operate as a speed matching buffer in order to receive transfers of data received through the interface circuit 102 or transferred to the interface circuit 102. A metadata log 118 can be maintained in the volatile memory 116 in order to record the parameters of any data written during the reduced performance operation of the solid state memory system 100.

The device processor 104 can access the metadata log 118, to read or update the content of the metadata log 118, from the volatile memory 116. In response to a dynamic power limit command, the device processor 104 can update the metadata log 118 with the configuration data from the power manager unit 110 in order to be able to restore the configuration of any user data written while the dynamic power limit command is in effect. The operations of the device processor 104 with the volatile memory 116 and the metadata log 118 can occur without reducing the availability of the interface circuit 102 to the next level system (not shown). The command execution timing can be managed by the device processor 104 without creating conflicts for the bandwidth of the volatile memory 116 or the non-volatile memory array 108 because the device processor 104 initiates the transfers through the interface circuit 102. In the case of a power loss or shut-down of the solid state memory system 100, the contents of the volatile memory 116, including the metadata log 118, can be copied to a reserved location in the non-volatile memory array 108. The contents of the volatile memory 116 can be reloaded upon a subsequent power-on.

It has been discovered that the device processor 104 can execute power limitation commands by reducing the solid state memory system 100 performance, capacity, configuration, or a combination thereof. The commensurate reduction in the operational power consumed by the solid state memory system 100 can benefit an application of the solid state memory system 100 by reducing background activities and allowing the application more available bandwidth, without risk to the data stored in the non-volatile memory array 108. Upon restoration of the performance power limit (full power operation), the configuration and voltages applied to the non-volatile memory array 108 can be restored in a background garbage collection task, without the assistance or knowledge of the next level system (not shown). During the garbage collection task, any data written during the reduced performance operation can be moved, reformatted, and written in full power writes. The restoration of the non-volatile memory array 108 can include re-writing data to a new location utilizing a full performance configuration.

Figure 2:
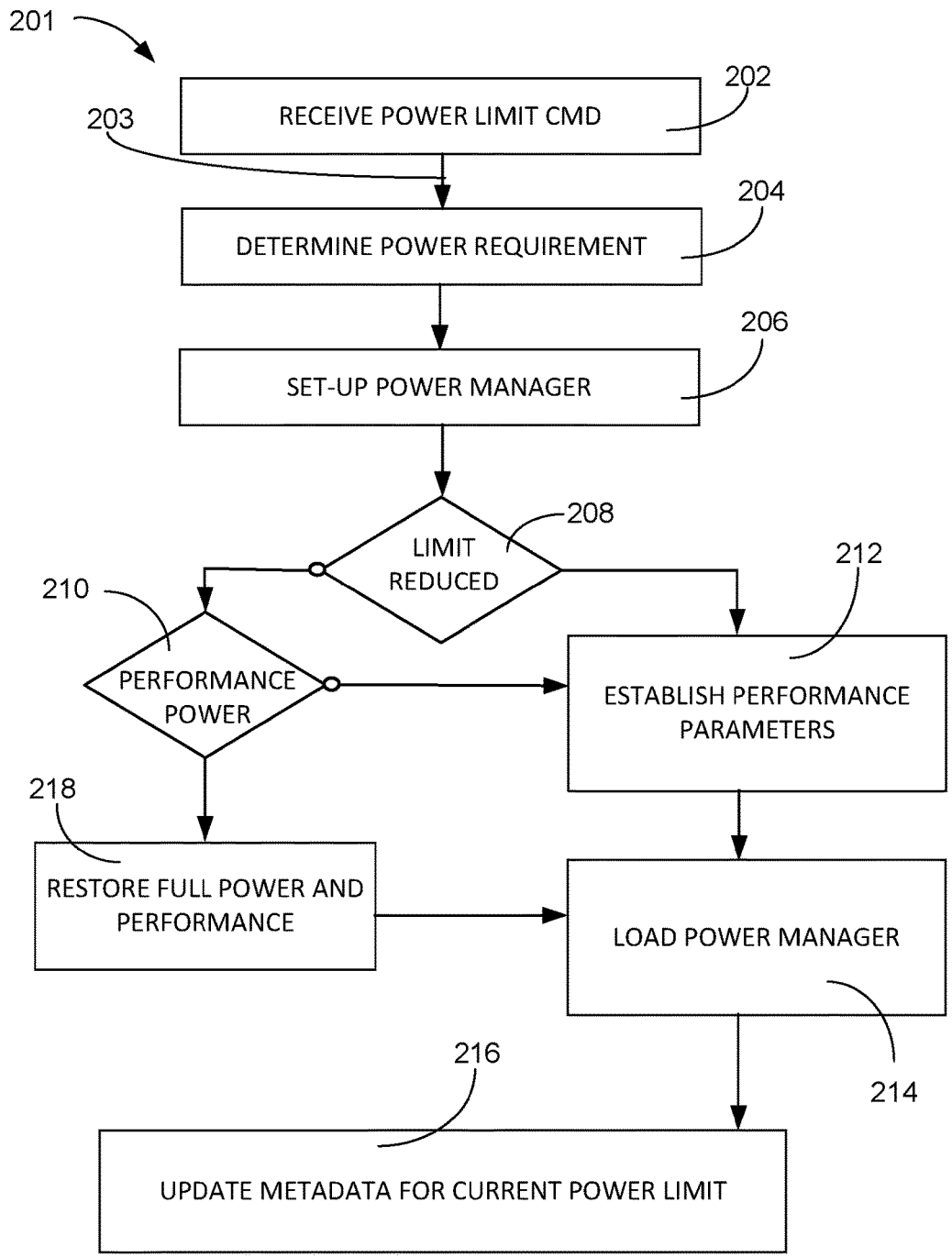
FIG. 2 is a flow chart of a dynamic power limit command processing in an embodiment.

Referring now to FIG. 2, therein is shown a flow chart of a dynamic power limit command processing 201 in an example embodiment. The flow chart of the dynamic power limit command processing 201 depicts the receipt of a dynamic power limit command 203 by the interface circuit 102 in a step 202. The device processor 104 can be coupled to the interface circuit 102 in order to receive the dynamic power limit command 203, prepare the interface circuit 102 for routing user data, manage stored data, or providing status to the dynamic power limit command 203 received in the step 202.

The device processor 104 can decode the dynamic power limit command 203 in order to determine the level of restriction of the power limit. The dynamic power limit command 203 can specify an absolute power limit, a range for the power limit, reduced voltage for write and erase, restricted configuration of the non-volatile memory array 108, defer background maintenance processes, or a combination thereof. The device processor 104 can utilize information stored in the device memory 106 to determine what additional power reduction can be required in order to satisfy the dynamic power limit command 203 in a step 204. The device processor 104 can configure the non-volatile memory 108, reduce the operating voltage of the write/erase voltage 312, or suspend the background tasks, such as a garbage collection task, a wear leveling task, or a combination thereof in the step 204.

The device processor 104 can communicate with the power manager unit 110 to establish the criteria needed to limit the power consumption and enable the check of the power feedback in a set-up power manager step 206. In an embodiment, the device processor 104 can enable the voltage manager unit 112 to reduce the write/erase voltage by a certain percentage of the normal operation (for example, 10%). In order to guarantee the operation of the non-volatile memory array 108, the duration of the write/erase operation can be extended, which can reduce performance. In another embodiment, the device processor 104 can instruct the address control unit 114 to only address the fast pages of an MLC flash memory, or restrict access to a fewer number of segments of the non-volatile memory array 108, amongst other possibilities.

The device processor 104 can identify whether the dynamic power limit command 203 results in a reduced power consumption level from the previous power consumption settings in a step 208. If the dynamic power limit command 203 does not further reduce the power consumption limits, the device processor 104 can check to see if the power level was increased to a higher performance power level, such as a full power and performance setting, by the dynamic power limit command 203 in a check for performance power step 210.

If the dynamic power limit command 203 does indicate a reduction in the power level from the previous power consumption settings in a reduced power limit step 208, the flow proceeds to establish performance parameters 212. The device processor 104 can calculate what configuration, operating mode, or power level changes are required to satisfy the dynamic power limit command. The device processor 104 can optionally utilize only low power pages within the configured segments of the non-volatile memory array 108, reduce the voltage levels of the write and erase operations, or a combination thereof. A shallow erase operation can erase a bit, using low voltage over a longer period of time, but can require an adjustment of the threshold for correctly detecting the bit. The adjusted threshold value can be stored in the metadata log 118 of FIG. 1. It is understood that the resulting configuration changes can reduce the capacity, performance, or a combination thereof in a temporary period during the dynamic power limit command 203. It is further understood that the background processes of a garbage collection task and wear leveling can re-write, reconfigure, or move any data that was written during the reduced power level of the dynamic power limit command 203 back to the full power and performance level with no host involvement.

As noted in the check for performance power step 210, the dynamic power limit command 203 can increase the power limit to establish a power limit that is increased from a previous level, but not restored to the full power and performance. The dynamic power limit command 203 can support specific operational modes that, by way of example, might require all available segments of the non-volatile memory array 108 be activated for performance reasons, but still operate on reduced write/erase voltages. In another example, all segments of the non-volatile memory array 108 may be activated, but restricted to using the lower power fast pages. The ability to customize the power consumption during periods of restricted power availability can represent a specific support for low power battery operation as well as a heat control mechanism in large data center installations.

When the device processor 104 has determined how to best support the dynamic power limit command 203, the flow proceeds to a load power manager step 214. The power manager unit 110 of FIG. 1 can, at the discretion of the device processor 104, reduce the operational voltage for write/erase, disconnect selected segments of the non-volatile memory array 108, rearrange the address coupling of fast and slow pages in the non-volatile memory array 108, restrict the operation to fast pages only, or a combination thereof. The device processor 104 can program registers within the power manager unit 110 that can control the restricted power operation. A power feedback mechanism can provide a dynamic adjustment to the control level specified in the dynamic power limit command 203. By way of an example, if the dynamic power limit command 203 specifies a fixed power limit and the usage of the solid state memory system 100 of FIG. 1 approaches the limit, the power manager unit 110 can dynamically reduce the write/erase voltage level, or flag the device processor 104 to suspend background tasks like wear leveling and garbage collection to limit the use of the write/erase voltages. This direct application of the power feedback can allow the solid state memory system 100 to dynamically reduce the power consumption by trading performance, capacity, or the combination thereof during the restricted power operations.

The flow then proceeds to an update metadata for current power limit step 216. The device processor 104, after loading the power manager unit 110, can log the power levels in the metadata log 118 for each command that is executed under the dynamic power limit command 203. The garbage collection task can access the metadata log 118 in order to determine how the data was written into the non-volatile memory array 108. During the garbage collection task the data that was written to the non-volatile memory array 108 can either maintain the restricted configuration, adopt a new power configuration, or be restored to the full power and performance configuration depending on the current state of the power level.

If the power restriction has ended, the check for performance power step 210 can detect the dynamic power limit command 203 that restores the solid state memory system 100 to full power and performance. The flow can proceed to a restore full power and performance step 218, in which the device processor 104 can activate the garbage collection task to restore all of the segments of the non-volatile memory array 108 in the next garbage collection task time. The metadata log 118 contains all of the operations that were performed under the dynamic power limit commands 203 that were active.

During a restricted power period, the solid state memory system 100 can have received one or more of the dynamic power limit command 203. The metadata log 118 can contain a list of all the conditions established during the execution of any data handling commands executed on the non-volatile memory array 108. The metadata log 118 enables the garbage collection task to relocate and reconfigure the user data within the non-volatile memory array 108 as though it was written during the full power and performance conditions.

The flow then proceeds to the load power manager step 214 in order to initialize the controls to restore the full voltage for write/erase and activate all of the segments of the non-volatile memory array 108 to restore full capacity. It is understood that the non-volatile memory array 108 can have additional reserved memory segments that can remain in a power reduced or power-off state until needed. The reserved memory segments can represent over-provisioning of the capacity of the solid state memory system 100 used during normal maintenance processes. The flow then proceeds to the update metadata for current power limit step 216 in order to flag all new data commands are executed under full power and performance conditions.

It has been discovered that the solid state memory system 100 can provide data handling support for read and write during power restricted operation and restore all stored data back to full power and performance condition when full power and performance is restored. The ability to operate at reduced performance and capacity during the dynamic power limit command 203 can include reducing the capacity by writing only fast pages in an MLC NAND device or reducing performance by decreasing the amplitude of the write/erase voltage, which can extend the time required to capture data in a memory cell. The ability to subsequently restore the data written to the non-volatile memory array 108, during full power and performance condition, is provided by the device processor 104, the power manager unit 110, and the metadata log 118. During the restoration of any of the user data written to the non-volatile memory array 108 during the power restricted period, the solid state memory system 100 is available for full performance operation. The ability of the dynamic power limit command 203 to control the power to a fixed limit, a range of operation, a voltage limit for write/erase, limit operation to a page type (only fast pages), control the addressing of mixed fast and slow pages, or a combination thereof, can allow the solid state memory system 100 to satisfy the demand for high performance and the flexibility to operate in transient power restricted conditions.

Figure 3:
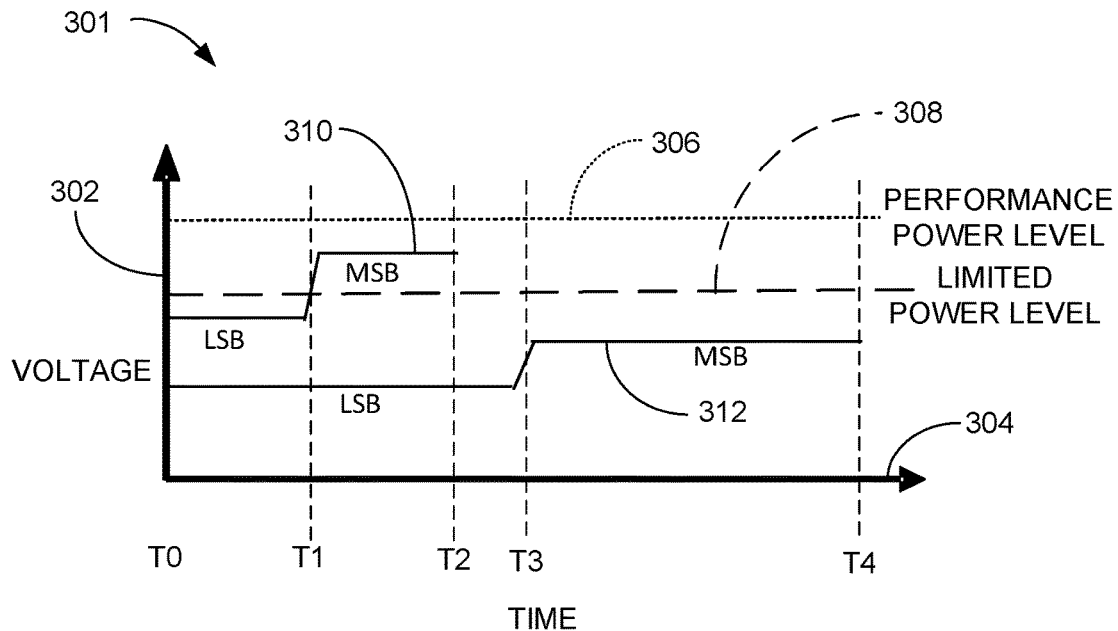
FIG. 3 is a timing diagram of a storage cell erase voltage profile in an embodiment.

Referring now to FIG. 3, therein is shown a timing diagram of a storage cell erase voltage profile 301 in an embodiment. The timing diagram of a storage cell erase voltage profile 301 can depict a write/erase voltage 302, on a vertical axis, and an elapsed time 304, on a horizontal axis. A performance power level 306 can be a default power level for full power operation of the non-volatile memory array 108 of FIG. 1. By way of an example, the performance power level 306 can be +/−20-25 volts in an embodiment. A limited power level 308 can be set by the power manager unit 110 of FIG. 1 in response to the dynamic power limit command 203 of FIG. 2. The limited power level 308 can be set to a percentage of the performance power level 306, a fixed voltage level, or a voltage range as specified by the dynamic power limit command 203. In an example embodiment the limited power level 308 the voltage can measure between +/−12-20 volts depending on the requirements of the dynamic power limit command 203.

In an embodiment, such as a multi-level cell (MLC) FLASH, a full performance write voltage 310 can be based on the performance power level 306. A section of the full performance write voltage 310, between T0 and T1, can write a fast page of the MLC FLASH. The MLC FLASH includes an oxide charge trap layer that is subjected to Fowler-Nordheim (FN) tunneling due to the large voltage differential provided by the full performance write voltage 310. The oxide charge trap layer can collect a charge until a specific threshold voltage is detected.

The duration of the fast page write between time T0 and T1 provides sufficient energy to condition the oxide charge trap layer to reflect the specific threshold voltage indicative of the data bit being written to the fast page. An elevated voltage section of the full performance write voltage 310, between T1 and T2, can write a slow page of the MLC FLASH. The additional voltage is required because the oxide charge trap layer already has been charged during the fast page write and can resist taking additional charge. The application of the three threshold levels used to detect the least significant bit (fast page) and the most significant bit (slow page) of the MLC FLASH cell, can require additional time to meet the threshold charge levels.

The limited power level 308 can be significantly lower than the performance power level 306. In response to the limited power level 308 the voltage manager unit 114 of FIG. 1 can generate a limited power write/erase voltage 312. The resulting effect on the MLC FLASH cell having the limited power write/erase voltage 312 is a slower migration of charge into the oxide charge trap layer. In order to achieve a comparable amount of charge in the oxide charge trap layer, the duration of the fast page programming can extend from T0 to T3, which extends beyond the time required by both the fast and slow pages in the case of the full performance write voltage 310. The limited power level 308 can restrict the limited power write/erase voltage 312 to further extend the duration of the slow page, between time T3 and T4, meeting an appropriate threshold voltage to reflect the bit value written to the MSB.

An abbreviated erase operation can take the shape of a shallow erase operation. In order to reduce the total energy used in the erase, the solid state memory system 100 of FIG. 1 can allow a reduced voltage to act on the targeted cells for a limited amount of time. At the end of the allotted time, if the cells are not completely erased, an adjusted voltage threshold can be used to detect the cells as erased. The value of the adjustment can be listed in the metadata log 118 of FIG. 1 for future use. When a full performance and voltage condition is restored, any data written to cells that were subject to the shallow erase can be, read with the adjusted threshold, erased with full power, and rewritten usually in a different location by the background tasks of garbage collection and wear-leveling.

The slower charging of the oxide charge trap layer can significantly reduce the power consumed by the solid state memory system 100 of FIG. 1 by adding significant latency to the write/erase timing. The additional latency results in a decrease in performance of the solid state memory system 100 during the power restricted period. In all cases, whether a low battery condition or an enterprise level data center reducing aggregate heat, the dynamic power limit command 203 can provide continued operation of the solid state memory system 100 while significantly reducing the power consumed.

The device processor 104 can be configured to control the time granularity of the write/erase operations in the range of micro-seconds to seconds in order to complete the write/erase requirements established by the dynamic power limit command 203. The adjustment of the time granularity can be specified in the dynamic power limit command 203 or calculated by the device processor 104 in response to the conditions of the dynamic power limit command 203.

It has been discovered that the restoration of the performance power level 306 by receiving the dynamic power limit command 203 indicating full power, will provide full performance operation from the solid state memory system 100. The ability to reduce the power required for the operation of the solid state memory system 100 can add needed flexibility to data storage applications for battery powered systems or large Enterprise data centers that require a means to limit the total power consumed for a period of time.

Figure 4:
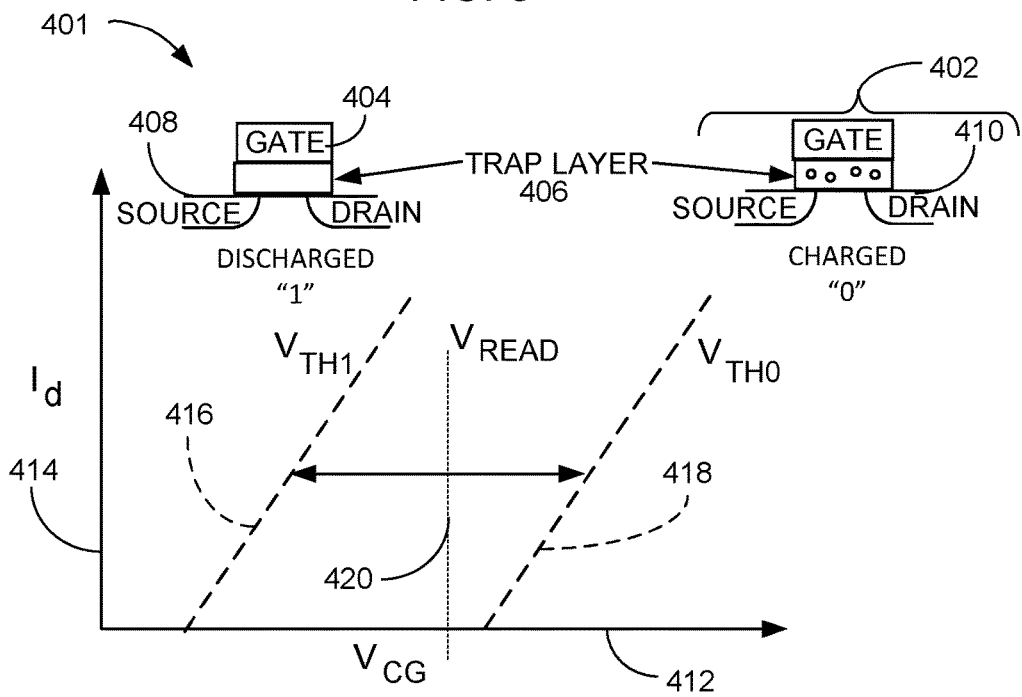
FIG. 4 is a threshold voltage plot of the storage cell in an embodiment.

Referring now to FIG. 4, therein is shown a threshold voltage plot 401 of a storage cell 402 in an embodiment. The threshold voltage plot 401 shows the storage cell 402 having a floating gate 404 over an oxide charge trap layer 406 that is formed on a semiconductor substrate having a source 408 and a drain 410.

The threshold voltage plot 401 depicts a horizontal axis indicating a value of a control gate voltage ($V_{CG}$) 412 having an increased value to the right. A vertical axis indicating a value of drain current ($I_d$) 414 having an increasing value in the upward direction. For ease of explanation the threshold voltage plot 401 depicts only a read operation of a single bit programmed in the storage cell 402.

The storage cell 402 can be discharged, having no charge trapped in the oxide charge trap layer 406, to indicate a bit value of "1" as shown on the left side of FIG. 4. The storage cell 402 can be charged, having an amount of charge that was forced into the oxide charge trap layer 406, to indicate a bit value of "0" as shown on the right side of FIG. 4. A threshold voltage for 1 bit ($V_{TH1}$) 416 can be dependent on the amount of $V_{CG}$ 412 applied to the storage cell 402. The amount of current detectable in $I_d$ 414 can be controlled by the $V_{CG}$ 412 that is applied.

For single bit operation a detection circuit would sense the $I_d$ 414 generated by read voltage ($V_{READ}$) 420 between the $V_{TH1}$ 416 and a threshold voltage for 0 bit ($V_{TH0}$) 418. Since the value of $V_{READ}$ 420 is too low to generate any $I_d$ 414 in the storage cell 402 that is programmed with a "0" bit, a detection of the $I_d$ 414 indicates that the storage cell 402 is programmed as a "1" and no detection of $I_d$ 414 indicates the storage cell 402 is programmed as a "0".

During the power restricted period, the amount of charge captured in the oxide charge trap layer 406 can be reduced based on the reduction of the limited power level 308 of FIG. 3 even though the duration of the write/erase is extended. During the write/erase operation, an adjusted value of the $V_{TH1}$ 416 or the $V_{TH0}$ 418 can be detected. The adjusted value of the $V_{TH1}$ 416 or the $V_{TH0}$ 418 can be added to the metadata log 118 of FIG. 1. The adjusted value of the $V_{TH1}$ 416 or the $V_{TH0}$ 418 can be used by the device processor 104 of FIG. 1 in order to configure a read operation of any of the storage cell 402 that were programmed/erased with the limited power level 308.

An abbreviated erase operation can take the shape of a shallow erase command. In order to reduce the total energy used in the erase, the solid state memory system 100 of FIG. 1 can allow a reduced voltage to act on the targeted cells for a limited amount of time. At the end of the allotted time, if the cells are not completely erased, an adjustment to the $V_{TH1}$ 416 can be used to detect the cells as erased. The value of the adjustment can be listed in the metadata log 118 with analogous levels for the $V_{TH0}$ 418 and the $V_{READ}$ 420 for future use. The device processor 104 must read the metadata log 118 to retrieve the adjusted threshold values of the $V_{TH1}$ 416, the $V_{TH0}$ 418, and the $V_{READ}$ 420 in order to correctly write or read any location in the non-volatile memory array that executed the shallow erase command. When a full performance and voltage condition is restored, any data written to cells that were subject to the shallow erase command can be, read with the adjusted threshold, erased with full power, and rewritten, usually in a different location, by the background tasks of garbage collection and wear-leveling.

It is understood that in an embodiment the device processor 104 can flag any of the storage cell 402 that were programmed/erased with the limited power level 308 to be refreshed by the garbage collection task when the performance power level 306 is restored. This process can assure that the solid state memory system 100 can meet all performance specifications when operating under the performance power level 306. It is further understood that storage cell 402 can be a MLC FLASH and can have additional levels of the threshold voltage $V_{THX}$ that can be used in a similar fashion during the power restricted period.

Figure 5:
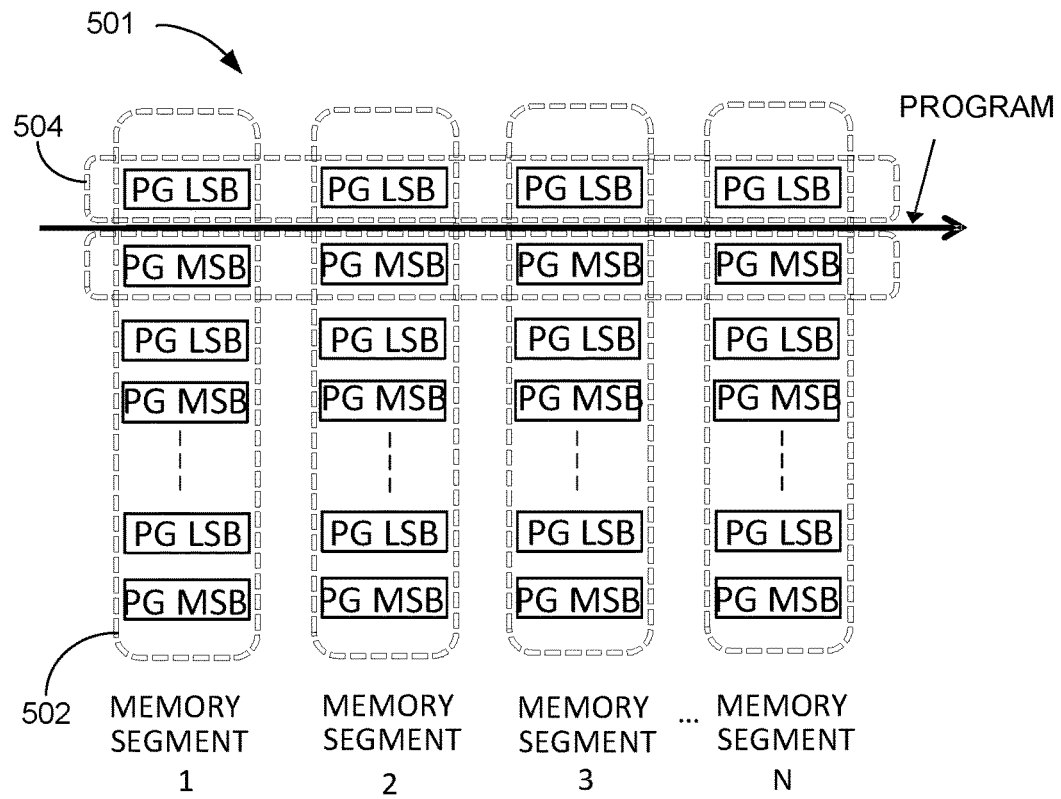
FIG. 5 is a functional block diagram of a nonvolatile memory array in a performance power mode of an embodiment.

Referring now to FIG. 5, therein is shown a functional block diagram of a non-volatile memory array 501 in a performance power mode write/erase operation of an embodiment. The functional block diagram of the non-volatile memory array 501 depicts a plurality of memory segments 502 arranged in a 1 through N array. The memory segments 502 can have individual address controls (not shown) and power controls (not shown) that can be controlled by the power manager unit 110 of FIG. 1. In an embodiment, the memory segments 502 can be independent structures of the MLC FLASH that can be grouped to form the non-volatile memory array 108 of FIG. 1.

In the write/erase operation, the non-volatile memory array 501 can be addressed to select a rank 504 across all of the memory segments 502 that are included in the write/ erase operation. Each page within the rank 504 can contain multiple bits and each bit can include one of the storage cell 402 of FIG. 4.

Each of the multiple bits has the storage cell 402 that can support two physical writes. The first is shown as a page least significant bit (PG LSB) and the second is shown as a page most significant bit (PG MSB) each of which is written/erased as described in FIG. 3. In an embodiment, each of the rank 504 within the memory segments 502 can support 4 MLC storage cells (not shown). Each of the rank 504 can contain 8 bits of user data when the PG LSB and the PG MSB are written consecutively as shown in FIG. 3.

Figure 6:
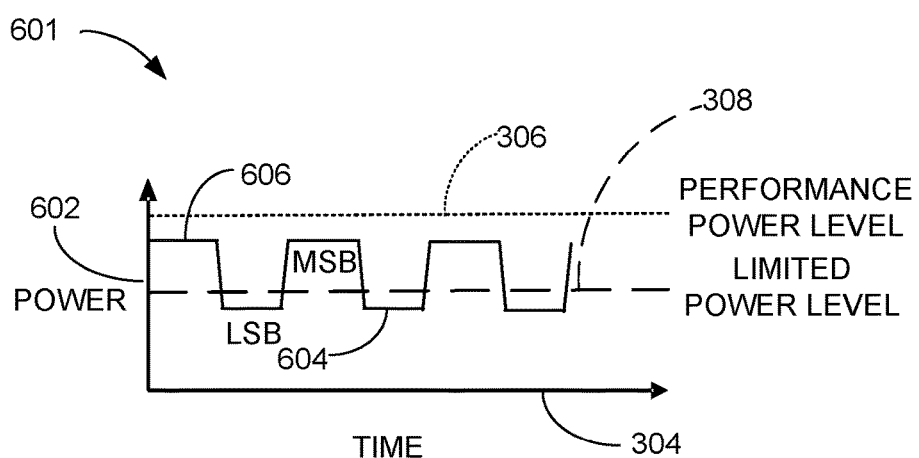
FIG. 6 is a power plot showing the performance power mode write/erase in an embodiment.

Referring now to FIG. 6, therein is shown a power plot 601 showing the performance power mode write/erase in an embodiment. The power plot 601 depicts the horizontal axis as the elapsed time 304 and a vertical axis is power consumed 602. The performance power level 306 marks the allowable power to be used in the full performance mode and the limited power level 308 is an example of a standard configuration of the non-volatile memory array 501 that is not able to meet the reduced power requirement.

It is understood that the LSB writes 604 do meet the requirement of the limited power level 308. The device processor 104 of FIG. 1 can exchange capacity for power reduction by configuring the power manager unit 110 of FIG. 1 to only use the LSB writes 604 during the reduced power requirement. The configuration change would be stored in the metadata log 118 of FIG. 1 for all commands that were written during the reduced power period. Once the full performance power is restored, the garbage collection task can use the meta data log 118 to identify which of the user data commands can be relocated, and move the user data to a new location using both the LSB writes 604 and MSB writes 606 in order to restore the original capacity of the solid state memory device 100 of FIG. 1. The garbage collection task is a background task, so no host level support is required.

Figure 7:
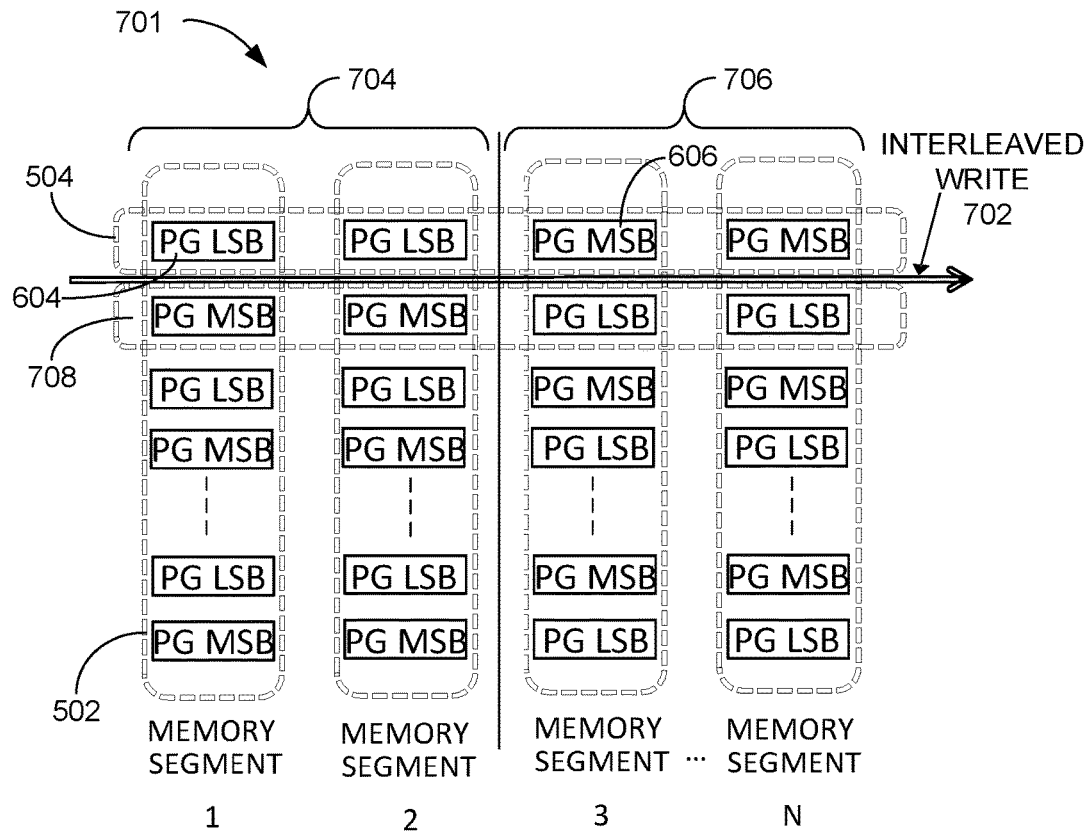
FIG. 7 is a functional block diagram of a nonvolatile memory array in a performance power mode of an embodiment.

Referring now to FIG. 7, therein is shown a functional block diagram of a nonvolatile memory array 701 in a limited power mode of an embodiment. The functional block diagram of a nonvolatile memory array 701 depicts an interleaved write 702 as a reduced power solution provided by the device processor 104 of FIG. 1 and the power manager unit 110 of FIG. 1.

In an embodiment, the memory segments 502 can be addressed independently, which allows the interleaved write 702 to execute in a first array split 704 the LSB write 604 at an address X and concurrently execute the MSB write 606 in a second array split 706 at address X−1. In a subsequent write 708, the MSB write 606 in the first array split 704 at address X and the LSB write 604 in the second array split 706 at address X. In the next write the first array split 704 can have the LSB write 604 at address X+1, while the second array split 706 can have the MSB write 606 at address X. The result of the interleaved write 702 is a net balancing of the power consumed by the ranks 504, which can lower the peak power consumed.

It is understood that the number of the memory segments 502 is an example only. In order to balance the power consumed in the interleaved write 702, the first array split 704 and the second array split 706 can include the same number of the memory segments 502. This method of reducing the peak power can be effective without a reduction in capacity or performance. It can also be effective for the dynamic power limit commands 203 of FIG. 2 that reduce the limited power write/erase voltage 312 of FIG. 3.

Figure 8:
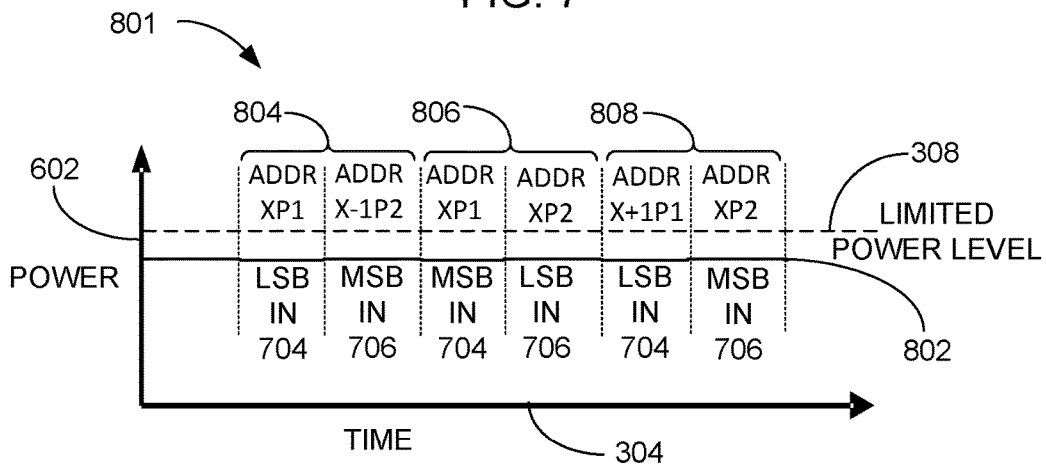
FIG. 8 is a power plot showing the limited power mode write/erase in an embodiment.

Referring now to FIG. 8 and FIG. 7, therein is shown a power plot 801 showing the interleaved write 702 in an embodiment. The power plot 801 showing the interleaved write 702 of FIG. 7 depicts a power feedback 802, for the interleaved write 702, which is maintained below the limited power level 308. The power feedback 802 can allow the voltage manager unit 112 to maintain the operation of the solid state memory system 100 of FIG. 1 below the limited power level 308. The device processor 104 of FIG. 1 can configure the power manager unit 110 of FIG. 1 to implement the interleaved addressing of the first array split 704 and the second array split 706 in order to minimize the power variation.

The power manager unit 110 can enable the address control unit 114 to address the first array split 704 and the second array split 706 in the interleaved pattern shown in a first interleaved write 804, a second interleaved write 806, and a third interleaved write 808. The power manager unit 110 can respond to the requirements of the dynamic power limit command 203 by configuring the voltage manager unit 112 to reduce the limited power write/erase voltage 312 of FIG. 3 or completely remove the supply voltage from selected groups of the memory segments 502 of FIG. 5.

The configuration of the non-volatile memory array 108 of FIG. 1 can be logged in the metadata log 118 of FIG. 1 in order to allow the garbage collection task to move the user data to a full performance and capacity configuration when the power restricted period is terminated.

In order to remap the user data to a reduced configuration of the non-volatile memory array 108, the user data can be divided into multiple parts in order to fit the configuration. For ease of explanation and clarity, the user data is referenced as part 1 of address X (ADDR XP1) and part 2 of address X (ADDR XP2). It is understood that other divisions of the user data are possible and can easily be accommodated. During the first interleaved write 804, the address control unit 114 can apply the least significant bits of a first portion of the user data for address X (ADDR XP1) to the fast pages in the first array split 704 and concurrently apply the most significant bits of a second portion of the user data for address X−1 (ADDR X−1P2) to the slow pages in the second array split 706. During the second interleaved write 806, the address control unit 114 can apply the most significant bits of the first portion of the user data for address X (ADDR XP1) to the slow pages in the first array split 704 and concurrently apply the least significant bits of the second portion of the user data for address X (ADDR XP2) to the fast pages in the second array split 706. The third interleaved write 808 can complete the data write for address X and start on the data for address X+1. The address control unit 114 can apply the least significant bits of the first portion of the user data for address X+1 (ADDR X+1P1) to the fast pages in the first array split 704 and concurrently apply the most significant bits of the second portion of the user data for address X (ADDR XP2) to the slow pages in the second array split 706.

The interleaved write 702 can maintain almost constant power consumption by splitting each of the first interleaved write 804, the second interleaved write 806, and the third interleaved write 808 evenly between writing fast pages and slow pages in different splits of the non-volatile memory array 108 as it is configured for the power restricted period. The configuration that is required to meet the dynamic power limit command 203 can be entered into the metadata log 118 and completely restored to a full performance configuration by the garbage collection task.

Figure 9:
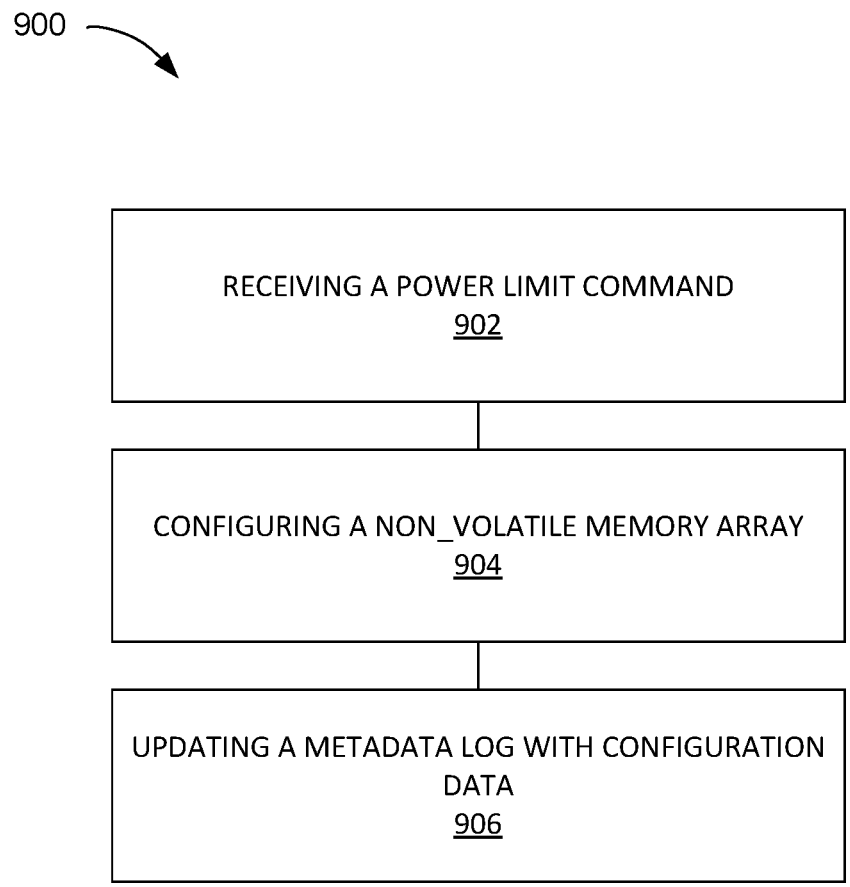
FIG. 9 is a flow chart of a method of operation of a solid state memory system in a further embodiment of the present invention.

Referring now to FIG. 9, therein is shown a flow chart of a method 900 of operation of a solid state memory system 100 in a further embodiment of the present invention. The method 900 includes: operating the solid state memory system 100 of FIG. 1 during a power restricted condition including monitoring a power feedback 802 of FIG. 8 to remain under a limited power level 308 of FIG. 3. The method 900 includes: receiving a dynamic power limit command 203 through an interface circuit 102 in a step 902; configuring a power manager unit 110 for altering a configuration of a non-volatile memory array 108 for meeting a requirement of the dynamic power limit command 203 in a step 904; and updating a metadata log 118 with configuration data from the power manager unit 110 in a step 906.

While embodiments of the invention have been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A solid state memory system comprising:
    an interface circuit;
    a device processor, coupled to the interface circuit, configured to receive a dynamic power limit command through the interface circuit and update a metadata log based on the dynamic power limit command and wherein the device processor is further configured to suspend background tasks, utilize only low power pages, update the metadata log with adjusted threshold for reduced voltage writes, and provide continued operation based on the dynamic power limit command;
    a non-volatile memory array coupled to the interface circuit; and
    a power manager unit, coupled to the device processor, configured by the device processor, wherein the device processor loads registers in the power manager unit to alter an operating configuration of the non-volatile memory array to meet the requirement of the dynamic power limit command received by the device processor, the power manager unit configured to adjust voltages for read, write, erase, and monitoring a voltage feedback in order to verify the dynamic power limit command is not exceeded.

2. The system as claimed in claim 1 wherein the power manager unit is further configured to generate a limited power write/erase voltage over a longer time in response to the dynamic power limit command.

3. The system as claimed in claim 1 further comprising a volatile memory, coupled to the interface circuit, that is configured to communicate with the device processor for updating the metadata log.

4. The system as claimed in claim 1 wherein the power manager unit is further configured to modify the addressing of memory segments in the non-volatile memory array.

5. The system as claimed in claim 1 wherein the device processor is further configured to execute a shallow erase on the non-volatile memory array by a limited power write/erase voltage for a fixed time and storing an adjustment to a threshold voltage for 0 bit ($V_{TH0}$), a threshold voltage for 1 bit ($V_{TH1}$), a read voltage ($V_{READ}$), or a combination thereof.

6. The system as claimed in claim 1 wherein the device processor is further configured to access the metadata log for threshold voltage adjusted value for a threshold voltage for 0 bit ($V_{TH0}$), a threshold voltage for 1 bit ($V_{TH1}$), or a read voltage ($V_{READ}$) to address the non-volatile memory array.

7. The system as claimed in claim 1 wherein the power manager unit is further configured to monitor a power feedback for adjusting a limited power write/erase voltage to remain less than a limited power level.

8. The system as claimed in claim 1 wherein the device processor is further configured to execute the dynamic power limit command including configuring the non-volatile memory array for only performing least significant bit (LBS) writes to reduce a total power consumed.

9. The system as claimed in claim 1 wherein the device processor is further configured to use the metadata log for restoring the non-volatile memory array when the device processor detects the dynamic power limit command that indicates a full power and performance command.

10. The system as claimed in claim 1 wherein the device processor is further configured to limit the execution of a garbage collection task if required by the dynamic power limit command.

11. A method of operation of a solid state memory system comprising:
    receiving a dynamic power limit command through an interface circuit for configuring a device processor to suspend background tasks, utilize only low power pages, update a metadata log with adjusted threshold for reduced voltage writes, and provide continued operation based on the dynamic power limit command;
    configuring a power manager unit, by the device processor, wherein the device processor loads registers in the power manager unit, for altering a configuration of a non-volatile memory array for meeting a requirement of the dynamic power limit command received by the device processor, includes the power manager unit configured to adjust voltages for read, write, erase, and monitoring a voltage feedback in order to verify the dynamic power limit command is not exceeded; and
    updating the metadata log with configuration data from the power manager unit.

12. The method as claimed in claim 11 further comprising generating a limited power write/erase voltage over a longer time in response to the dynamic power limit command.

13. The method as claimed in claim 11 wherein updating the metadata log includes the device processor communicating with the volatile memory.

14. The method as claimed in claim 11 further comprising modifying the addressing of memory segments in the non-volatile memory array.

15. The method as claimed in claim 11 further comprising executing a shallow erase on the non-volatile memory array by a limited power write/erase voltage for a fixed time and storing an adjustment to a threshold voltage for 0 bit ($V_{TH0}$), a threshold voltage for 1 bit ($V_{TH1}$), a read voltage ($V_{READ}$), or a combination thereof.

16. The method as claimed in claim 11 further comprising accessing the metadata log for threshold voltage adjusted value for a threshold voltage for 0 bit ($V_{TH0}$), a threshold voltage for 1 bit ($V_{TH1}$), or a read voltage ($V_{READ}$) for addressing the non-volatile memory array.

17. The method as claimed in claim 11 further comprising monitoring a power feedback for adjusting a limited power write/erase voltage less than a limited power level.

18. The method as claimed in claim 11 further comprising configuring the device processor for executing the dynamic power limit command including configuring the non-volatile memory array for only performing least significant bit (LBS) writes for reducing a total power consumed.

19. The method as claimed in claim 11 further comprising accessing the metadata log for restoring the non-volatile memory array based on the device processor receiving the dynamic power limit command indicating a full power and performance.

20. The method as claimed in claim 11 further comprising limiting executing a garbage collection task if required by the dynamic power limit command.

* * * * *